United States Patent
Hirose et al.

(10) Patent No.: US 6,551,522 B2
(45) Date of Patent: Apr. 22, 2003

(54) PIEZOELECTRIC CERAMICS

(75) Inventors: Masakazu Hirose, Tokyo (JP); Takeo Tsukada, Tokyo (JP); Hitoshi Oka, Tokyo (JP); Junji Terauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 29 days.

(21) Appl. No.: 09/778,080

(22) Filed: Feb. 7, 2001

(65) Prior Publication Data

US 2001/0015420 A1 Aug. 23, 2001

(30) Foreign Application Priority Data

Feb. 8, 2000 (JP) ......................................... 2000-030731
Feb. 21, 2000 (JP) ......................................... 2000-043630

(51) Int. Cl.[7] ...................... C04B 35/453; H01L 41/187
(52) U.S. Cl. ................... 252/62.9 R; 501/137; 501/139
(58) Field of Search ...................... 252/62.9 R; 501/137, 501/139

(56) References Cited

U.S. PATENT DOCUMENTS

| | | | |
|---|---|---|---|
| 6,004,474 A | 12/1999 | Takenaka et al. | 252/62.9 R |
| 6,080,327 A | 6/2000 | Takenaka et al. | 252/62.9 R |
| 6,241,908 B1 * | 6/2001 | Hirose et al. | 252/62.9 R |
| 6,248,254 B1 * | 6/2001 | Kimura et al. | 252/62.9 R |

FOREIGN PATENT DOCUMENTS

| | | |
|---|---|---|
| EP | 1063209 | * 12/2000 |
| JP | 9-100156 | 4/1997 |
| JP | 2000-143340 | 5/2000 |
| JP | 2000-264727 | 9/2000 |
| JP | 2000-313662 | * 11/2000 |

OTHER PUBLICATIONS

Masakazu Hirose, et al., *Piezoelectric Properties of $SrBi_4Ti_4O_{15}$ Based Ceramics*, of the lecture abstracts of the 16th Meeting on Ferroelectric Materials and Their Applications, pp. 97–98, 1999.

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

Piezoelectric ceramics include a bismuth layer compound containing $M^{II}$, Bi, Ti, Ln and O, wherein $M^{II}$ represents at least one element selected from the group consisting of Sr, Ba and Ca, and Ln represents at least one element selected from the group consisting of lanthanoids. The piezoelectric ceramics include $M^{II}Bi_4Ti_4O_{15}$ typed crystals, and a mole ratio of $Ln/(Ln+M^{II})$ is $0<Ln/(Ln+M^{II})<0.5$. In the case where $M^{II}$ is Sr, a mole ratio of 4Bi/Ti is $4.000<4Bi/Ti\leq4.030$. Preferably, piezoelectric ceramics further include Y oxide.

8 Claims, 3 Drawing Sheets

PIEZOELECTRIC CERAMICS

BACKGROUND OF THE INVENTION

1. Field of the Invention

The present invention relates to a piezoelectric ceramics to be applicable widely in the field of a resonator, a pressure sensor, or the like.

2. Description of the Related Art

A piezoelectric element is a material having the piezoelectric effect of changing the electric polarization by the external stress, and the inverse piezoelectric effect of generating strain by the electric field application. The piezoelectric element is adopted in a sensor, a resonator, an actuator, or the like, for measuring the pressure or the deformation.

Most of piezoelectric materials practically used now are commonly ferroelectric elements having a perovskite structure based on PZT ($PbZrO_3$—$PbTiO_3$ solid solution) of a tetragonal system or a rhombohedral system, or based on PT ($PbTiO_3$) of a tetragonal system. By adding various sub components thereto, various characteristics are provided as requested.

However, most of the PZT-based or PT-based piezoelectric materials have a 300 to 350° C. Curie temperature in a practical composition. In contrast, since a process temperature in a present soldering step is, in general, 230 to 250° C., a piezoelectric material with a 300 to 350° C. Curie temperature can easily generate characteristic deterioration in the soldering step. Besides, in the case where a solder not containing a lead (lead-free solder) is used practically, the process temperature in the soldering step is further higher. Therefore, it is extremely important to have the Curie temperature of the piezoelectric material higher.

Moreover, since the lead-based piezoelectric materials contain a large content (about 60 to 70 wt %) of a lead oxide (PbO) having an extremely high volatility even at a low temperature, they are not preferable from the viewpoints of ecology and pollution prevention. Specifically, in producing the lead-based piezoelectric materials as ceramics or a single crystal, a heat treatment such as firing and melting is inevitable, and thus the lead oxide as a volatile component can be volatilized and dispersed by an extremely large amount in an industrial level. Furthermore, although the lead oxide discharged in the production step can be collected, most of the lead oxide contained in the piezoelectric materials dispatched to the market as industrial merchandises cannot be collected in the present situation. Therefore, in the case where it is discharged widely in the environment, it should inevitably be the cause of pollution.

As a lead-free piezoelectric material, for example, $BaTiO_3$ of a perovskite structure belonging to a tetragonal system is well known. However, since it has a low Curie temperature of 120° C., it is not practical. Moreover, JP-A-9-100156 discloses a (1−x) $(Bi_{1/2}Na_{1/2})TiO_3$—$xNaNbO_3$ solid solution of a perovskite structure; however, those having a Curie temperature higher than 370° C. are not included.

As a piezoelectric element capable of having a Curie temperature of 500° C. or more, for example, a bismuth layer compound (a compound shaped in bismuth layer) is known. Since the bismuth layer compound has a high Curie temperature, once it is polarized, it is thermally stable and thus characteristics sufficient for a sensor for high temperature can be obtained. On the other hand, a problem is involved in that sufficient piezoelectric characteristics can be hardly obtained for difficulty of the polarization itself. Furthermore, a lead-free bismuth layer compound involves a problem in that Qmax important in the case where it is adopted in a resonator is small. Qmax is tanθmax wherein θmax represents the maximum value of the phase angle. That is, it is the maximum value of Q (=|X|/R) between the resonant frequency and the antiresonant frequency wherein X denotes the reactance and R denotes the resistance. With larger Qmax, the vibration can be stabilized, and further, the vibration is enabled with a low voltage.

A report on improvement of Qmax of a lead-free bismuth layer compound is disclosed on pages 97–98 of the lecture abstracts of the 16th Meeting on Ferroelectric Materials and Their Applications (May 26–29, 1999). In this abstract, $(Sr_{1-x}Me_x)Bi_4Ti_4O_{15}$, wherein Me represents Ba, Ca, La, Sm, or Gd, with Ba and Ca added in the range of $x \leq 0.1$, Sm and Gd $X \leq 0.4$, and La $x \leq 0.5$, is provided as the lead-free bismuth layer compound. In the abstract, Qmax is measured in the thickness extensional fundamental vibration mode. FIG. 2 show the improvement of Qmax by addition of an La, and decline of Qmax by addition of Ba or Ca.

In the case of adopting piezoelectric ceramics in a resonator or a filter, small temperature dependency of the resonant frequency is required. However, piezoelectric ceramics having Qmax sufficiently large for the practical use as a resonator and small temperature dependency of the resonant frequency has not been reported so far.

SUMMARY OF THE INVENTION

An object of the present invention is to provide lead-free piezoelectric ceramics having a high Curie temperature, the excellent piezoelectric characteristics, and small temperature dependency of the resonant frequency.

The above-mentioned object can be achieved by the invention of the below-mentioned items (1) to (5).

(1) Piezoelectric ceramics comprising bismuth layer compounds containing $M^{II}$, Bi, Ti, Ln and O, wherein $M^{II}$ represents at least one element selected from the group consisting of Sr, Ba and Ca, and Ln represents at least one element selected from the group consisting of lanthanoids. The piezoelectric ceramics contain $M^{II}Bi_4Ti_4O_{15}$ typed crystals wherein a mole ratio of $Ln/(M^{II}+Ln)$ is $0<Ln/(M^{II}+Ln)<0.5$ and a mole ratio of $4Bi/Ti$ is $4.000<4Bi/Ti \leq 4.030$.

(2) The piezoelectric ceramic according to the above-mentioned item (1), containing Mn oxide.

(3) The piezoelectric ceramic according to the above-mentioned item (2), wherein a content of Mn oxide is less than 0.62 wt % in terms of MnO.

(4) The piezoelectric ceramic according to any of the above-mentioned items (1) to (3), further containing Co oxide.

(5) The piezoelectric ceramic according to the above-mentioned item (4), wherein a content of Co oxide is less than 0.7 wt % in terms of CoO.

Further, the above-mentioned object can be achieved by the invention of the following items (6) to (8).

(6) Piezoelectric ceramics comprising bismuth layer compounds containing $M^{II}$, Bi, Ti, Ln and O, wherein $M^{II}$ represents at least one element selected from the group consisting of Sr, Ba and Ca, and Ln represents at least one element selected from the group consisting of lanthanoids. The piezoelectric ceramics contain $M^{II}Bi_4Ti_4O_{15}$ typed crystals wherein a mole ratio of $Ln/(Ln+M^{II})$ is $0<Ln/(Ln+M^{II})<0.5$, and the piezoelectric ceramics further contain Y oxide.

(7) The piezoelectric ceramics according to the above-mentioned item (6), wherein a content of Y oxide is contained by 0.5 wt % or less in terms of the $Y_2O_3$.

(8) The piezoelectric ceramics according to the above-mentioned item (6) or (7), containing Mn oxide and/or Co oxide.

DETAILED DESCRIPTION OF THE PREFERRED EMBODIMENTS

Figure 1:
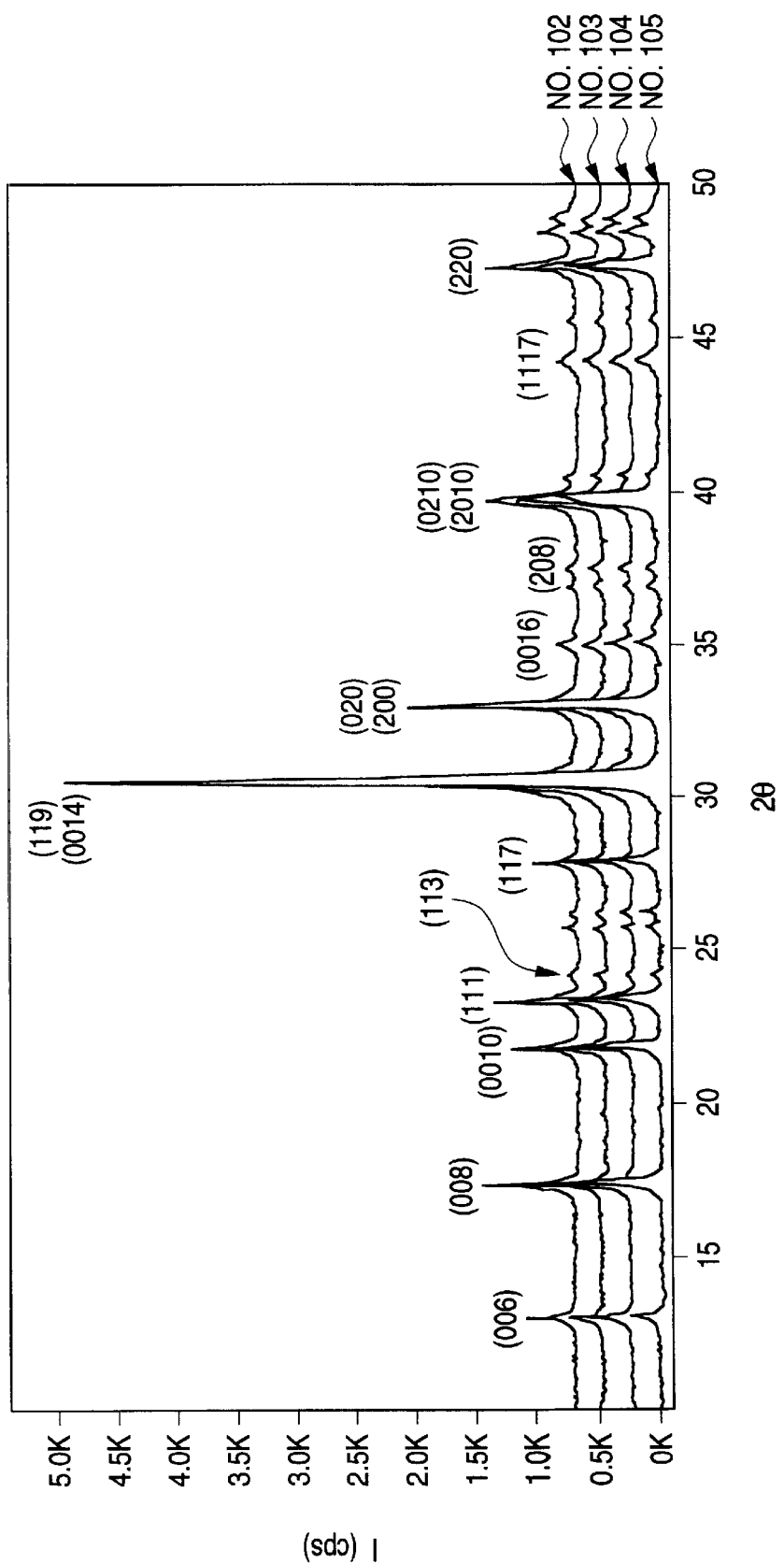
FIG. 1 is an X ray diffraction chart of piezoelectric ceramics for the samples Nos. 102–105.
Figure 2:
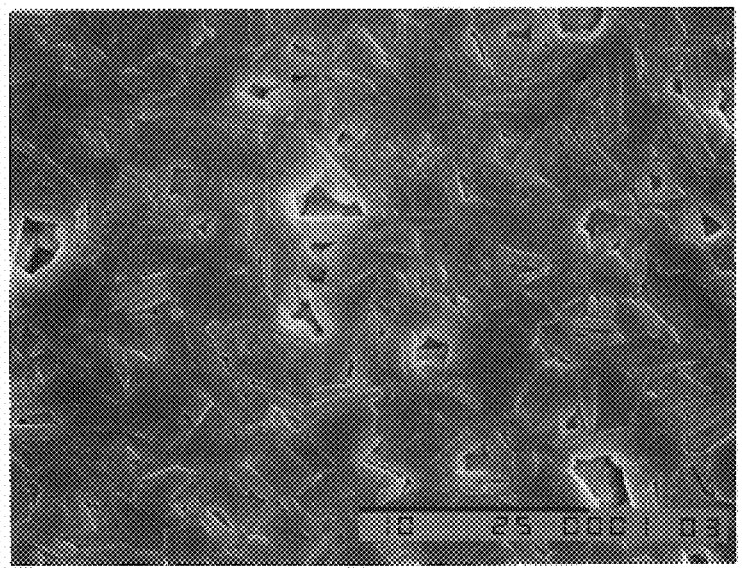
FIG. 2 is a scanning electron microscope photograph of Sample No. 102 in TABLE 2, showing the grain structure.
Figure 3:
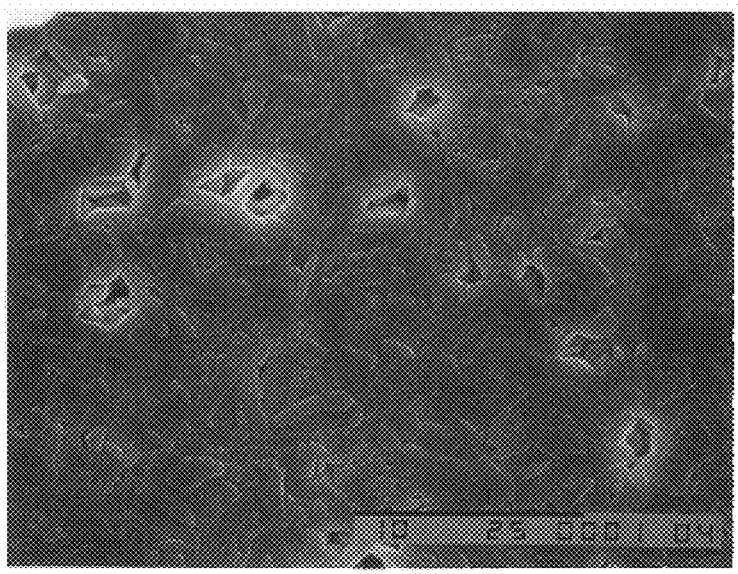
FIG. 3 is a scanning electron microscope photograph of Sample No. 103 in TABLE 2, showing the grain structure.
Figure 4:
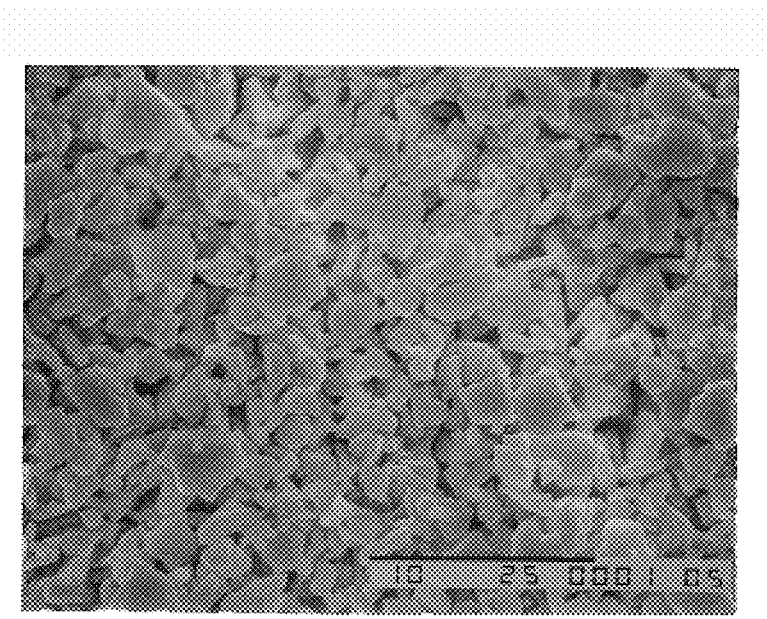
FIG. 4 is a scanning electron microscope photograph of Sample No. 104 in TABLE 2, showing the grain structure.
Figure 5:
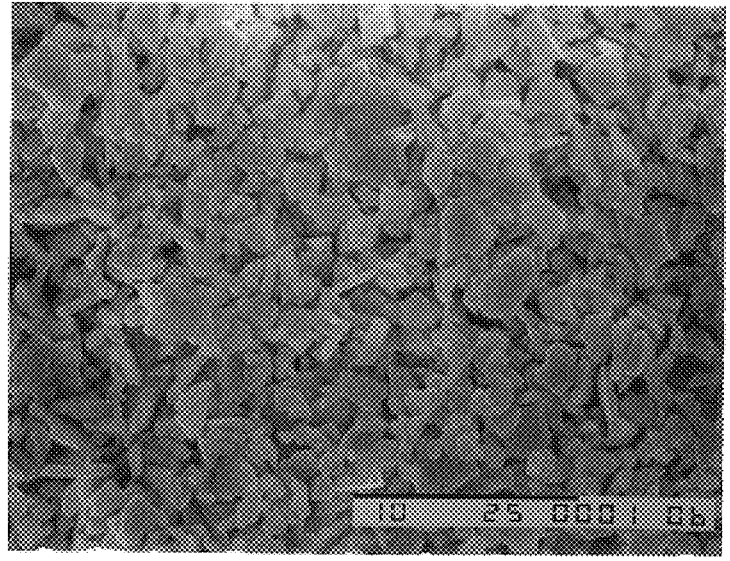
FIG. 5 is a scanning electron microscope photograph of Sample No. 105 in TABLE 2, showing the grain structure.

Piezoelectric ceramics according to the invention comprise a bismuth layer compound containing $M''$, Bi, Ti, Ln and O. $M''$ represents at least one element selected from the group consisting of Sr, Ba and Ca, and Ln represents at least one element selected from the group consisting of lanthanoids. In other words, the piezoelectric ceramics of the present invention are composite oxide containing $M''Bi_4Ti_4O_{15}$ typed crystals.

In the piezoelectric ceramic according to the present invention, the mole ratio of 4Bi/Ti is preferably $4.000<4Bi/Ti\leq4.030$. By containing Bi richer than $M''Bi_4Ti_4O_{15}$ of the stoichiometric composition, Qmax can be improved. However, if 4Bi/Ti is more than 4.03, insulation resistance is lowered so that polarization process becomes difficult. Moreover, Qmax is lowered on the contrary. In order to have the improvement ratio of Qmax higher, it is preferable that $4.010<4Bi/Ti$. Moreover, in order to further restrain decline of the insulation resistance, it is preferable that $4Bi/Ti\leq4.028$.

Further, in order to improve Qmax, the piezoelectric ceramics according to the present invention contain lanthanoid oxide. The lanthanoids include La, Ce, Pr, Nd, Pm, Sm, Eu, Gd, Tb, Dy, Ho, Er, Tm, Yb and Lu. Among them, at least one selected from the group consisting of La, Nd, Sm, Gd, Dy, Ho, Er and Yb is preferable, and La is most preferable. The mole ratio of $Ln/(Ln+M'')$ in the piezoelectric ceramics of the present invention is $0<Ln/(Ln+M'')<0.5$, and is preferably $0.03\leq Ln/(Ln+M'')\leq 0.3$. If the Ln/(Ln+ $M''$) is too large, Qmax is lowered on the contrary. Improvement of Qmax by addition of Ln oxide is considered to be owing to improvement of the sintering property. Ln oxide-free $M''Bi_4Ti_4O_{15}$ based ceramics, in particular, $CaBi_4Ti_4O_{15}$ based ceramics are hardly polarized; however, it can be improved by addition of Ln oxide.

In addition to Ln oxide, it is preferable that piezoelectric ceramics according to the present invention contain Y oxide. By adding Y oxide in combination with Ln oxide, temperature characteristics of the material at the resonant frequency can be improved. Further, sufficiently large Qmax can be obtained. A content of Y oxide is preferably 0.5 wt % or less, more preferably 0.4 wt % or less in terms of $Y_2O_3$. If the content of Y oxide is too large, Qmax is lowered. In contrast, in order to sufficiently obtain the effect of adding Y oxide, it is preferable to contain Y oxide by 0.1 wt % or more, in particular, by 0.2 wt % or more in terms of $Y_2O_3$.

By containing Mn oxide and/or Co oxide in the piezoelectric ceramics according to the present invention, Qmax can be further improved. In particular, by adding Mn oxide in combination with Ln oxide, Qmax can be improved remarkably.

In order to sufficiently obtain the effect of adding Mn oxide, it is preferable to contain Mn oxide by 0.02 wt % or more in terms of MnO. In the case where it is contained by 0.03 wt % or more, the improvement in Qmax can be particularly high. However, since the insulation resistance is made lower so that the polarization process becomes difficult if the content of Mn oxide is too high, the content of Mn oxide is preferably less than 0.62 wt %, more preferably 0.60 wt % or less, and further preferably 0.43 wt % or less in terms of MnO. In contrast, in order to sufficiently obtain the effect of adding Mn oxide, it is preferable to contain Mn oxide by 0.02 wt % or more in terms of MnO. In the case where it is contained by 0.03 wt % or more, improvement in Qmax can be particularly high.

As mentioned above, Qmax can also be improved by containing Co oxide. In order to sufficiently obtain the effect of adding Co oxide, it is preferable that the content is 0.1 wt % or more in terms of CoO. However, if the content of Co oxide is excessive, insulation resistance is made larger so that polarization process becomes difficult. Therefore, the content in terms of CoO is preferably less than 0.7 wt %, and more preferably 0.5 wt % or less.

It is preferable that the mole ratio in $M''$ represented as $Sr_xBa_yCa_z$ (wherein $x+y+z=1$) is:
$0\leq x\leq 1$,
$0\leq y\leq 0.9$, and
$0\leq z\leq 1$.

If the ratio y of Ba in $M''$ is too high, the piezoelectric ceramics can be easily melted at the time of firing.

It is preferable that the piezoelectric ceramics according to the present invention contain $M''Bi_4Ti_4O_{15}$ typed crystals of a bismuth layer compound, and substantially comprises the crystals. However, it is also possible that they are not completely homogeneous and contain a different phase. In the piezoelectric ceramics, Ln is considered to substitute mainly the $M''$ site in the $M''Bi_4Ti_4O_{15}$ typed crystals, but it can partially substitute another site, or it can exist partially in the grain boundary.

The entire composition of the piezoelectric ceramic according to the present invention can be, in general, $(M''_{1-a}Ln_a)Bi_bTi_4O$ (wherein $0<a\leq 1$) with 4Bi/Ti (=b) in the above-mentioned range, and with MnO or CoO added thereto in the case where Mn oxide or Co oxide is contained, but it can be deviated therefrom. For example, a ratio of ($M''$+Ln) with respect to Ti may be deviated by about ±5% from the stoichiometric composition. Moreover, the oxygen amount can be varied depending upon the valence number of the metal element or the oxygen defect.

Further, the entire composition of the piezoelectric ceramics according to the present invention can be, in general, $(M''_{1-x}Ln_x)Bi_4Ti_4O_{15}$ (wherein $0<x\leq 1$) with adding $Y_2O_3$, but it can be deviated therefrom. For example, the ratio of ($M''$+Ln) with respect to Ti and the ratio of Ti with respect to Ti may be deviated by about ±5% from the stoichiometric composition. Moreover, as above, the oxygen content can be varied depending upon the valence number of the metal element, the oxygen defect or the like.

In the piezoelectric ceramics according to the present invention, Pb oxide, Cr oxide, Fe oxide, or the like may be contained as an impurity or a minor additive. It is preferable that the content of these oxides is 0.5 wt % or less with respect to the entirety in terms of an oxide of the stoichiometric composition such as PbO, $Cr_2O_3$, and $Fe_2O_3$. Further, it is preferable that the total of these oxides is 0.5 wt % or less. If the content of these oxides is too large, the effect of the present invention may be deteriorated. Although it is most preferable that Pb is not contained in the piezoelectric ceramics according to the present invention, a content of the above-mentioned range is not substantially problematic.

Crystal grains of the piezoelectric ceramics according to the present invention are spindle-shaped or needle-shaped. The average size of the crystal particle is not particularly limited, but preferably 1 to 10 $\mu$m, more preferably 3 to 5 $\mu$m in the longitudinal direction.

The Curie temperature of the piezoelectric ceramics according to the present invention is at least 380° C. or more, and it can easily be 430° C. or more.

The piezoelectric ceramics according to the present invention are suitable for a resonator, a high temperature sensor, an actuator, or the like. For the good temperature characteristics of the resonant frequency, it is particularly suitable for a resonator.

The application mode of the piezoelectric ceramics according to the present invention is not particularly limited; therefore, any mode such as thickness extensional vibration mode, and thickness sliding vibration can be used. In the thickness extensional fundamental vibration mode, relatively high Qmax can be obtained. However, since much spurious vibration is generated, consequently the vibration stability is slightly lowered. In contrast, in third harmonic mode of the thickness extensional vibration mode, Qmax is smaller but the spurious vibration can be reduced. In contrast, in thickness sliding fundamental vibration, the spurious vibration is small as well as sufficiently large Qmax can be obtained.

According to the study by the present inventors, in the case of the thickness sliding vibration, it was learned that the temperature characteristics of the resonant frequency is relatively steep and the temperature dependency of the oscillating frequency is relatively large. As a result of further experiments, it was found out that the temperature characteristics of the resonant frequency can be flattened considerably by setting a mole ratio in $M^{II}$:

$x/6+0.2 \leq y \leq 0.8$.

That is, by using at least Ba and/or Ca as $M^{II}$ and having the ratio of Ba+Ca in $M^{II}$ in a predetermined range.

Although the case of piezoelectric ceramics containing $M^{II}Bi_4Ti_4O_{15}$ typed crystals have been explained so far, Qmax can be improved by deviating a ratio of contained metal elements from the stoichiometric composition also in piezoelectric ceramics containing, for example, $M^{II}Bi_2Nb_2O_9$ typed crystals, $M^{II}Bi_2Ta_2O_9$ typed crystal, $Bi_3TiNbO_9$ typed crystals, $Bi_4Ti_3O_{12}$ typed crystals, $Bi_{4.5}M'_{0.5}Ti_4O_{15}$ typed crystals (wherein M' is at least one selected from the group consisting of alkaline metal elements such as Na and K), or an $M^{II}_2Bi_4Ti_5O_{18}$ typed crystals.

Production Method

An example of a method for producing the piezoelectric ceramics according to the present invention will be explained.

First, as starting materials, powders of oxide, or a compound to be converted to oxide by firing, such as carbonate, hydroxide, oxalate, and nitrate, specifically, $M^{II}CO_3$, $Bi_2O_3$, $TiO_2$, $La_2O_3$, $MnO_2$, $MnCO_3$, $Y_2O_3$, or the like are prepared so as to be wet-mixed by a ball mill or the like.

Then, the mixture is calcined. In general, it is temporarily formed before calcination. Calcining temperature is preferably 700 to 1,000° C., more preferably 750 to 850° C. If the calcining temperature is too low, the chemical reaction cannot be completed sufficiently; thus, the calcination is insufficient. In contrast, if the calcining temperature is too high, since the temporarily formed product starts to be sintered, the subsequent grinding process becomes difficult. The calcining time is not particularly limited, but it is preferable, in general, from 1 to 3 hours.

The obtained calcined product is processed to be a slurry so as to be wet-ground by a ball mill, or the like. An average particle size of the powders obtained by grinding is not particularly limited, but in consideration of the subsequent forming convenience, it is preferably about 1 to 5 $\mu$m.

After wet-grinding, the powders of the calcined product are dried. After adding a small amount (about 4 to 10 wt %) of water, the dried product is press-formed at pressure of about 100 to 400 MPa so as to obtain a formed product. At the time, a binder such as a polyvinyl alcohol may be added.

Then, the formed product is fired so as to obtain piezoelectric ceramics. The firing temperature is selected preferably in the range of from 1,100 to 1,300° C., and the firing time is preferably about 1 to 5 hours. The firing operation may be executed in the atmosphere, in an atmosphere with an oxygen partial pressure lower than or higher than that of the atmosphere, or in a pure oxygen atmosphere.

After the firing operation, a polarization process is applied. The conditions for the polarization process may be optionally determined depending on the composition of the piezoelectric ceramics. However, in general, the poling temperature can be 150 to 300° C., the poling time can be 1 to 30 minutes, and the poling electric field can be 1.1 times or more as much as the coercive field.

EXAMPLE 1

By the following procedures, a first set of samples (No. 1 to No. 13) of the piezoelectric ceramics shown in TABLE 1 were produced.

As starting materials, powders of $SrCO_3$, $Bi_2O_3$, $TiO_2$, $La_2O_3$, and $MnCO_3$ were mixed so as to have the final composition as $Sr_{0.9}La_{0.1}Bi_bTi_4O_{15}+MnCO_3$ (0.5 wt %), and wet-mixed by a ball mill utilizing a zirconia ball in pure water for 16 hours. The b representing a content of Bi in the final composition is shown in TABLE 1.

Then, after drying sufficiently and temporary forming, the mixture was calcined in the air for 2 hours. The calcining temperature was selected from the range of 800 to 1,000° C. The obtained calcined product was coarsely ground with a mortar, and further ground by a grinder. After grinding finely by a ball mill for 16 hours, it was dried. A 10% polyvinyl alcohol solution was added thereto as a binder by 10 wt % for granulation. Then, the product was press-formed with applying a load of 300 MPa so as to obtain a formed product of 20 mm×20 mm in planar size and 13 mm in thickness. The formed product was vacuum-packed, and formed with a cooling isostatic press at pressure of 400 MPa.

The obtained formed product was fired. The firing operation was executed in a sealed MgO container to prevent evaporation of Bi. The firing temperature was selected in the range of from 1,120 to 1,235° C., and the firing time was 4 hours.

From the obtained sintered product, a plate-like element of 15 mm×15 mm in planar size and 0.55 mm in thickness was cut out, and was subjected to lapping so as to obtain a thin plate of 440 $\mu$m in thickness. Cu electrodes were formed on both sides of the thin plate by evaporation so as to obtain a sample for measuring piezoelectric characteristics and a sample for measuring specific resistance.

The sample for measuring piezoelectric characteristic was subjected to a polarization process by applying an electric field of 1.5×Ec (MV/m) or more for 1 minute in a silicone oil bath of 250° C. The above-mentioned Ec denotes the coercive field of each sintered product at 250° C.

After eliminating the Cu electrodes by erosion with a FeCl$_2$ solution, a chip was obtained by cutting out to be 7 mm×4.5 mm in planar size with the polarization direction oriented in the thickness direction. Ag electrodes for evaluating the thickness extensional vibration mode was formed on both surfaces of the chip by evaporation. The diameter of the Ag electrode was 1.5 mm in diameter and 1 µm in thickness.

Impedance characteristics were measured in the third harmonic mode of the thickness extensional vibration mode for each sample for finding Qmax, using an impedance analyzer HP4194A by Hewlett Packard Corp. Results are shown in TABLE 1.

Moreover, the sample for measuring specific resistance was subjected to 100 V voltage at 250° C. for measuring specific resistance. Results are shown in TABLE 1.

TABLE 1

| Sample No. | b | Qmax | Specific Resistance (Ωcm) |
|---|---|---|---|
| 1 (comparative) | 3.874* | 3.2941 | 5.06 × 10$^9$ |
| 2 (comparative) | 3.927* | 3.0527 | 3.11 × 10$^9$ |
| 3 (comparative) | 3.962* | 7.9218 | 2.86 × 10$^9$ |
| 4 (comparative) | 3.976* | 9.7807 | 1.02 × 10$^9$ |
| 5 (comparative) | 3.988* | 9.8662 | 1.00 × 10$^9$ |
| 6 (comparative) | 3.990* | 10.0972 | 7.27 × 10$^8$ |
| 7 (comparative) | 3.993* | 10.4652 | 6.80 × 10$^8$ |
| 8 | 4.013 | 11.6176 | 5.34 × 10$^8$ |
| 9 | 4.018 | 12.7677 | 4.71 × 10$^8$ |
| 10 | 4.019 | 12.0188 | 4.05 × 10$^8$ |
| 11 | 4.026 | 13.7195 | 3.36 × 10$^8$ |
| 12 | 4.029 | 11.0420 | 2.26 × 10$^8$ |
| 13 (comparative) | 4.041* | 6.4221 | 2.06 × 10$^6$ |

*Out of the limited range

From TABLE 1, it is learned that by having Bi rich within the range of the present invention, Qmax can be improved critically as well as sufficiently high specific resistance can be obtained.

The Curie temperature of all of the samples of the present invention shown in TABLE 1 was 510° C. or more. By analyzing the samples of the present invention shown in TABLE 1 with powder X ray diffraction method, it was confirmed that a substantially single phase of an M$^{11}$Bi$_4$Ti$_4$O$_{15}$ typed crystals was formed.

Although the samples in the above-mentioned embodiment have a composition with Mn added, improvement in Qmax was observed by excessive addition of Bi even in the case of not adding Mn, or the case of adding Co instead of a part or the entirety of Mn.

According to the present invention, it was confirmed that a piezoelectric ceramic having a high Curie temperature and the excellent piezoelectric characteristics can be realized.

EXAMPLE 2

By the following procedures, a second set of samples (No.101 to No.107) of the piezoelectric ceramics shown in TABLE 2 were produced.

As starting materials, powders of SrCO$_3$, Bi$_2$O$_3$, TiO$_2$, La$_2$O$_3$, Gd$_2$O$_3$, MnCO$_3$, and Y$_2$O$_3$ were mixed so as to have final compositions as Sr$_{1-x}$Ln$_x$Bi$_4$Ti$_4$O$_{15}$+MnO+Y$_2$O$_3$ (content of MnO and Y$_2$O$_3$ is as shown in TABLE 2), and wet-mixed by a ball mill utilizing a zirconia ball in pure water for 15 hours. Ln and x are shown in TABLE 2.

Then, after drying sufficiently and temporary forming, the mixture was calcined in the atmosphere for 2 hours. The calcining temperature was selected from the range of 750 to 900° C. The obtained calcined product was ground by a ball mill and dried. A 10% polyvinyl alcohol solution was added thereto as a binder by 10 wt % for granulation. Then, the product was press-formed by a one-axis press forming machine with applying a load of 300 MPa so as to obtain a formed product of 20 mm×20 mm in planar size and 1.5 mm in thickness.

The obtained formed product was heat-treated for volatilizing the binder, and fired in the atmosphere. The firing operation was executed in a sealed MgO container for preventing evaporation of Bi. The firing temperature was selected in the range of from 1,150 to 1,300° C., and the firing time was 2 to 4 hours.

The obtained sintered product was lapped to be 0.5 mm in thickness, and cut out to be 15 mm×15 mm in planar size so as to obtain a thin plate. Cu electrodes were formed on both sides of the thin plate by evaporation. Then, a polarization process was performed by applying a 5 to 15 MV/m electric field for 1 to 10 minutes in a silicone oil bath of 150 to 300° C.

After eliminating the Cu electrodes by erosion with a FeCl$_2$ solution, the plate was lapped to be 0.44 in thickness, and cut out to be 7 mm×4.5 mm in planar size with the polarization direction oriented in the thickness direction so as to obtain a chip. Ag electrodes for evaluating the thickness extensional vibration mode was formed on both sides of the chip by evaporation. The diameter of Ag electrodes was 1.5 mm in diameter and 1 µm in thickness.

Qmax of third harmonic mode of the thickness extensional vibration mode was measured for each sample at about 16 MHz, using an impedance analyzer HP4194A by Hewlett Packard Corp. Results are shown in TABLE 2.

Moreover, resonant frequency was measured in the temperature range of from 20 to 85° C., using the impedance analyzer and a temperature chamber. With resonant frequency at 20° C. fr$_{20}$ and resonant frequency at 85° C. fr$_{85}$, a resonant frequency change ratio Δfr with the value at 20° C. as the reference was calculated by the formula:

$$\Delta fr = 100 \times (fr_{85} - fr_{20})/fr_{20} [\%].$$

Results are shown in TABLE 2.

TABLE 2

| Sample No. | Ln | x | MnO (wt %) | Y$_2$O$_3$ (wt %) | Frequency Change Ratio (%) | Qmax |
|---|---|---|---|---|---|---|
| 101 | Gd | 0.1 | 0.31 | 0.1 | −0.199 | 11.4 |
| 102 (comparative) | Gd | 0.1 | 0.31 | — | −0.221 | 11.2 |
| 103 | Gd | 0.1 | 0.25 | 0.1 | −0.208 | 11.4 |
| 104 | Gd | 0.1 | 0.19 | 0.2 | −0.202 | 8.0 |
| 105 | Gd | 0.1 | 0.12 | 0.3 | −0.183 | 5.7 |
| 106 (comparative) | La | 0.1 | 0.31 | — | −0.250 | 10.1 |
| 107 | La | 0.1 | — | 0.5 | −0.165 | 5.0 |

From TABLE 2, it is learned that according to the piezoelectric ceramics of the present invention, Qmax sufficiently large for the practical use as a resonator, that is, Qmax of 5 or more can be obtained, and the temperature dependency of resonant frequency is small.

The Curie temperature of all of the samples of the present invention shown in TABLE 2 was 450° C. or more.

By grinding the samples of the present invention shown in TABLE 2, and analyzing the same with powder X ray diffraction method, it was confirmed that a substantially single phase of $M^{II}Bi_4Ti_4O_{15}$ typed crystals was formed. The X ray diffraction charts of Samples No. 102 to No. 105 are shown in FIG. 1. Since segregation of Y is not confirmed in any of the samples in FIG. 1, Y is considered to exist in crystal lattices. For these samples, each lattice constant in a axis was calculated from each diffraction peak in (200) plane, and each lattice constant in c axis was calculated from each diffraction peak in (008) plane. As a result, change in lattice constant was not substantially observed by adding Y. Therefore, Y is considered to exist in the crystals in the sate of a substituted solid solution.

Samples No. 102 to No. 105 in TABLE 2 were subjected to polishing and to chemical etching in the same conditions. Then, they are photographed by a SEM (scanning type electron microscope). SEM photographs of Samples No. 102 to No. 105 are shown in FIGS. 2 to 5. Since dissolution of grain boundaries proceeds by adding a larger content of Y in these photographs, Y possibly exists in a large quantity in the boundary parts.

According to the present invention, lead-free piezoelectric ceramics having a high Curie temperature, the excellent piezoelectric characteristics, and small temperature dependency of resonant frequency can be realized.

What is claimed is:

1. Piezoelectric ceramics comprising:

compounds shaped in bismuth layer containing $M^{II}$, Bi, Ti, Ln and O; and $M^{II}Bi_4Ti_4O_{15}$ typed crystals, wherein $M^{II}$ represents at least one element selected from the group consisting of Sr, Ba and Ca, and Ln represents at least one element selected from the group consisting of lanthanoids, and a mole ratio of $Ln/(M^{II}+Ln)$ is $0<Ln/(M^{II}+Ln)<0.5$, and a mole ratio of 4Bi/Ti is $4.000<4Bi/Ti \leq 4.030$.

2. The piezoelectric ceramics according to claim 1, further comprising Mn oxide.

3. The piezoelectric ceramics according to claim 2, wherein a content of Mn oxide is less than 0.62 wt % in terms of the MnO.

4. The piezoelectric ceramics according to claim 1, further comprising Co oxide.

5. The piezoelectric ceramics according to claim 4, wherein a content of Co oxide is less than 0.7 wt % in terms of CoO.

6. Piezoelectric ceramics comprising:

compounds shaped in bismuth layer containing $M^{II}$, Bi, Ti, Ln and O;

$M^{II}Bi_4Ti_4O_{15}$ typed crystals; and

Y oxide, wherein $M^{II}$ represents at least one element selected from the group consisting of Sr, Ba and Ca, and Ln represents at least one element selected from the group consisting of lanthanoids, and a mole ratio of $Ln/(Ln+M^{II})$ is $0<Ln/(Ln+M^{II})<0.5$.

7. The piezoelectric ceramics according to claim 6, wherein a content of Y oxide is 0.5 wt % or less in terms of the $Y_2O_3$.

8. The piezoelectric ceramics according to claim 6, further comprising at least one of Mn oxide and Co oxide.

* * * * *